United States Patent
Lee et al.

[11] Patent Number: 6,100,182
[45] Date of Patent: Aug. 8, 2000

[54] METHOD FOR FORMING METAL INTERCONNECTION OF SEMICONDUCTOR DEVICE

[75] Inventors: Kyeong Bock Lee; Sung Gon Jin; Noh Jung Kwak, all of Gyunggi-do, Rep. of Korea

[73] Assignee: Hyundai Electronics Industries, Co., Ltd., Yicheon, Rep. of Korea

[21] Appl. No.: 09/081,668

[22] Filed: May 20, 1998

[30] Foreign Application Priority Data

Jun. 23, 1997 [KR] Rep. of Korea ............ 97-26608

[51] Int. Cl.[7] .............. H01L 21/4763; H01L 21/44; H01L 29/40

[52] U.S. Cl. .................... 438/637; 438/643; 438/648; 438/649; 438/653; 438/654; 438/655; 438/656; 438/660; 438/688; 257/751; 257/753; 257/757; 257/765

[58] Field of Search .................. 438/637, 643, 438/648, 649, 653–656, 660, 663, 664, 668; 257/751, 753, 757, 764, 765

[56] References Cited

U.S. PATENT DOCUMENTS

| | | |
|---|---|---|
| 4,732,865 | 3/1988 | Evans et al. ............ 437/12 |
| 4,755,480 | 7/1988 | Yau et al. ............ 437/47 |
| 5,155,063 | 10/1992 | Ito ............ 437/190 |
| 5,225,372 | 7/1993 | Savkar et al. ............ 437/190 |
| 5,231,052 | 7/1993 | Lu et al. ............ 437/190 |
| 5,312,772 | 5/1994 | Yokoyama et al. ............ 437/190 |
| 5,312,775 | 5/1994 | Fujii et al. ............ 437/192 |
| 5,356,836 | 10/1994 | Chen et al. ............ 437/194 |
| 5,358,901 | 10/1994 | Fiordalice et al. ............ 437/192 |
| 5,488,014 | 1/1996 | Harada et al. ............ 437/192 |
| 5,554,565 | 9/1996 | Liaw et al. ............ 437/192 |
| 5,591,672 | 1/1997 | Lee et al. ............ 437/190 |
| 5,654,234 | 8/1997 | Shih et al. ............ 438/643 |
| 5,654,235 | 8/1997 | Matsumoto et al. ............ 438/643 |
| 5,674,787 | 10/1997 | Zhao et al. ............ 437/230 |

*Primary Examiner*—John F. Niebling
*Assistant Examiner*—Ha Tran Nguyen
*Attorney, Agent, or Firm*—Oliff & Berridge, PLC

[57] ABSTRACT

A method for forming metal interconnection of semiconductor device is disclosed. In the present invention, an aluminum layer in the 10 to 100 Å range is deposited on the bottom of the contact before or after the deposition of a titanium layer for barrier metal, which forms $TiAl_3$ by the reaction of titanium and aluminum. According to the invention, stable contact resistance and low leakage current can be obtained in the application of ultra shallow junction.

18 Claims, 3 Drawing Sheets

[Fig. 1a] PRIOR ART
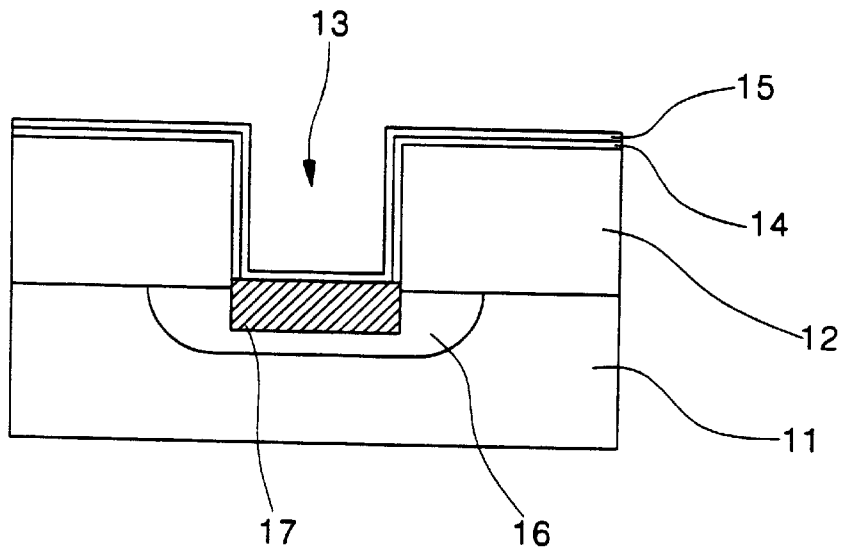
[Fig. 1b] PRIOR ART
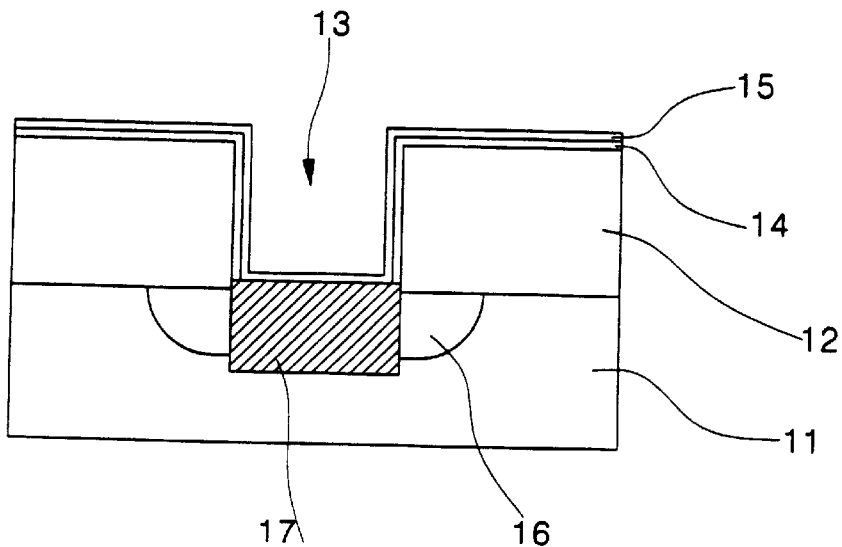

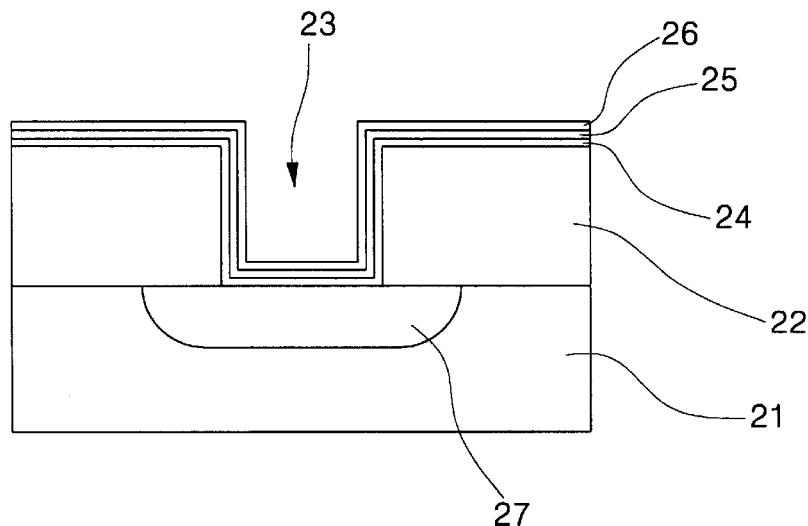
[Fig. 2a]
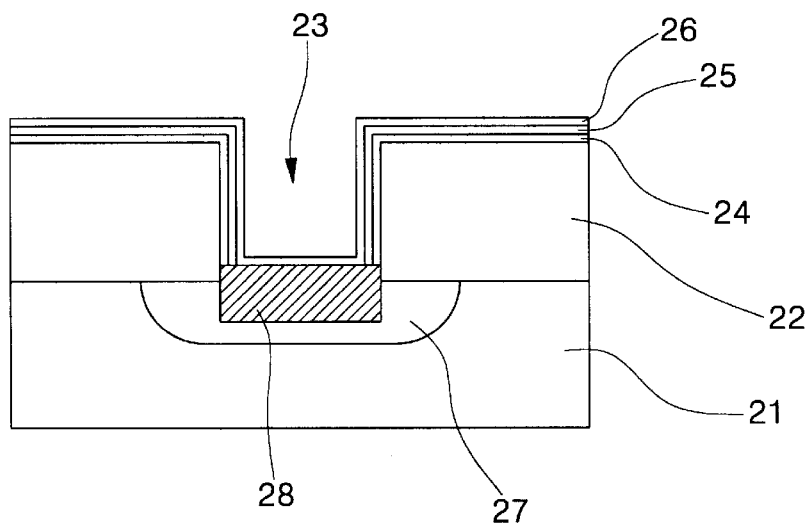
[Fig. 2b]
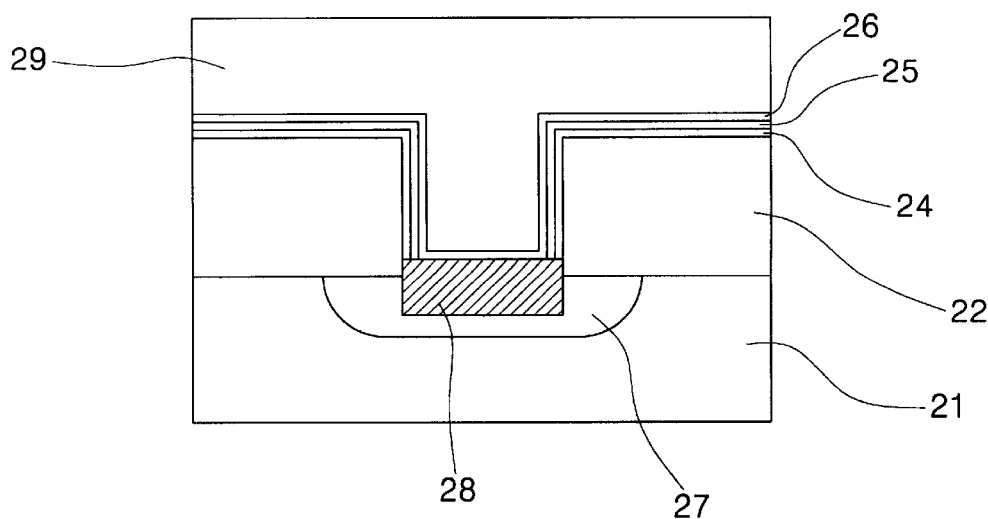
[Fig. 2c]

[Fig. 3a]
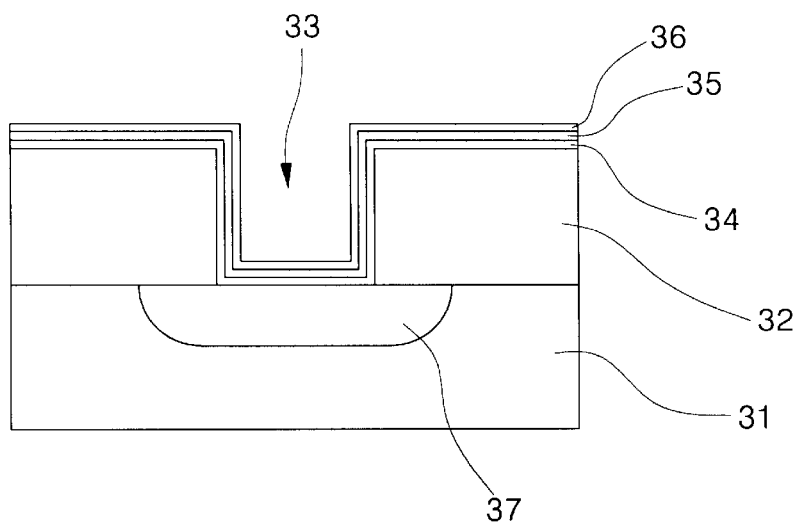
[Fig. 3b]
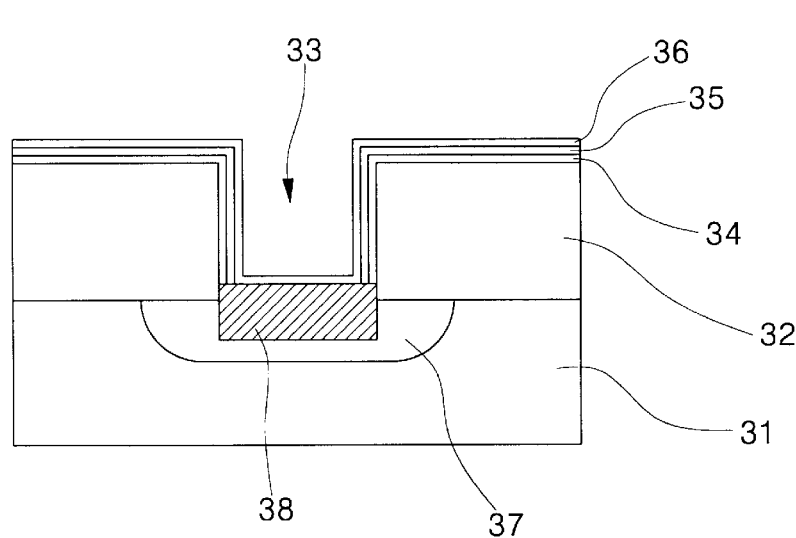
[Fig. 3c]
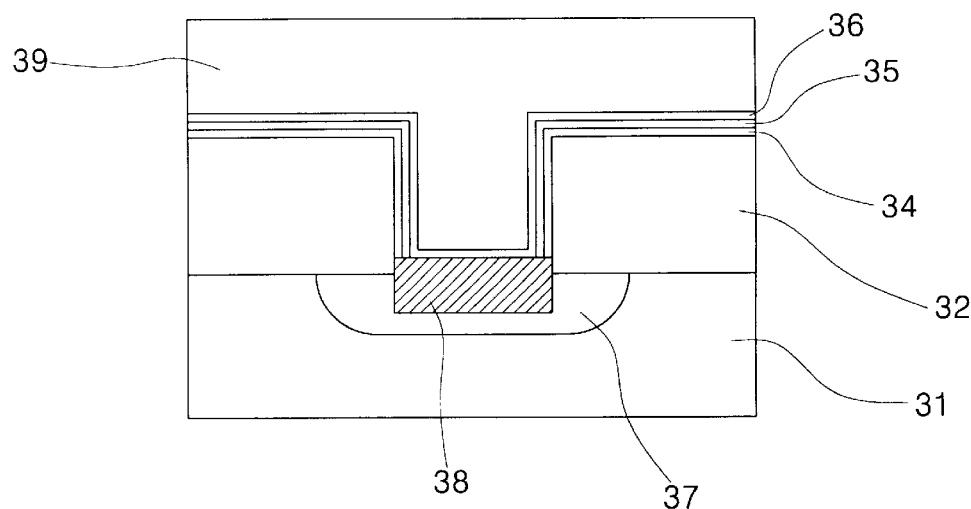

METHOD FOR FORMING METAL INTERCONNECTION OF SEMICONDUCTOR DEVICE

BACKGROUND OF THE INVENTION

1. Field of the Invention

The present invention relates to a semiconductor device fabricating method, more particularly to a method for forming metal interconnection of semiconductor device.

2. Description of the Prior Art

So far, titanium nitride(TiN) layer has been deposited after the deposition of titanium(Ti) layer to make a good ohmic contact between silicon(Si) and metal layer as well as to form a superior barrier metal layer in forming metal interconnection. The problems of the conventional technique will be described referring to FIG. 1a and FIG. 1b.

As shown in FIG. 1a, after forming an insulating layer 12 on a silicon wafer 11, a contact hole 13 is made in the insulating layer by etching the selected region of insulating layer 12. A Ti layer 14 and a TiN layer 15 are consecutively formed on the overall structure including contact hole 13. Ti layer 14 deposited on a junction 16 reacts with Si to form $TiSi_2$ layer 17 having low resistivity through successive thermal process, and stable contact resistance can be obtained by the elimination of damaged layer, defect layer, natural oxide layer or the like generated from contact etch.

Also as semiconductor device is highly integrated, ultra shallow junction having a junction depth of 0.1 to 0.15 mm is required. If the conventional method is applied to the ultra shallow junction for the formation of a barrier metal layer, the formation of $TiSi_2$ layer 17 by the reaction between Ti layer 14 and the Si of junction 16 causes problems. The problems include increase of both leakage current and contact resistance due to excessive consumption of dopants and Si of junction. Therefore, junction breakdown can be induced when $TiSi_2$ layer 17 is formed with a thickness thicker than the junction depth.

FIG. 1b is a cross sectional view showing such a junction breakdown.

On the other hand, another method of the conventional metal interconnection process employs a $TiSi_x$ (x>2) target to form a barrier metal layer. In this case, relatively stable contact resistance can be obtained since $TiSi_2$ layer having resistivity less than that of Ti is deposited. However, this method can not eliminate damaged layer, defect layer or natural oxide layer generated from contact etch since the $TiSi_2$ layer is formed without a reaction with Si of junction. Therefore this method is limited to in device application.

SUMMARY OF THE INVENTION

Therefore, the object of the present invention is to provide a method for forming metal interconnection of semiconductor device capable of providing stable contact resistance and low leakage current in the application of ultra shallow junction.

In order to accomplish the aforementioned object, the first embodiment of the present invention provides a method for forming metal interconnection of semiconductor device, comprising the steps of:

making a contact hole in an insulating layer by etching a selected region of the insulating layer after forming the insulating layer on a silicon wafer; forming Ti layer on the overall structure after post-cleaning of the contact hole formation; consecutively forming aluminum(Al) and TiN layers on the Ti layer; forming $TiSi_2/TiAl_3$ at a junction by thermally treating the resultant wherein the TiN layer is formed; and forming a tungsten(W) layer on the overall structure.

In order to accomplish the aforementioned object, the second embodiment of the present invention provides a method for forming metal interconnection of semiconductor device, comprising the steps of:

making a contact hole in an insulating layer by etching a selected region of the insulating layer after forming the insulating layer on a silicon wafer; forming an Al layer on the overall structure after post-cleaning of the contact hole formation; consecutively forming Ti and TiN layers on the Al layer; forming $TiAl_3/TiSi_2$ at a junction by thermally treating the resultant wherein the TiN layer is formed; and forming a W layer on the overall structure.

According to the present invention, the Al layer is deposited on the bottom of the contact before or after the deposition of Ti layer for barrier metal, which forms $TiAl_3$ by the reaction of Ti and Al. The formation of $TiAl_3$ can prevent the increase of leakage current induced by excessive $TiSi_2$ formation. Also, the contact resistance of p+ region can be lowered by the contact of Al with Si in the p+ region.

BRIEF DESCRIPTION OF THE DRAWINGS

The detailed description particularly refers to the accompanying drawings in which:

FIG. 1a to FIG. 1b are the cross sectional views of semiconductor device that sequentially describe the conventional method for forming metal interconnection;

FIG. 2a to FIG. 2c are the cross sectional views of semiconductor device that sequentially describe the method for forming metal interconnection according to the first embodiment of the present invention;

FIG. 3a to FIG. 3c are the cross sectional views of semiconductor device that sequentially describe the method for forming metal interconnection according to the second embodiment of the present invention.

DETAILED DESCRIPTION OF THE PREFERRED EMBODIMENTS

Hereinafter, the present invention will be described in detail referring to the accompanying drawings.

As shown in FIG. 2a, initially after forming an insulating layer 22 on a silicon wafer 21, a contact hole 23 is made in insulating layer 22 by selectively etching insulating layer 22.

Pre-cleaning is performed using $CF_4/O_2$ or BOE(buffered oxide etchant; $NH_4F+HF+H_2O$) to eliminate the natural oxide layer built up on the bottom of the contact hole.

Then, to make a stable contact with Si, Ti layer 24 in the 300 to 1000 Å range is formed under the deposition temperature of about normal room temperature to about 300° C. and the reaction chamber pressure of 2 to 5 mTorr. After the formation of Ti layer 24, an Al layer 25 in the 10 to 100 Å range is formed on the bottom of the contact using an Al-0.5%Cu-1%Si target. The deposition of the Al layer with excessive thickness would induce the junction breakdown of Al/Si junction. Therefore, it is important to exactly control the thickness of the Al layer.

Generally, the step coverage of Al gets deteriorated with the increase in the contact aspect ratio of device. Therefore, the Al layer is formed at a relatively low temperature of less than 200° C. and at a pressure of less than 3 mTorr to enhance the step coverage of the Al layer. After the formation of Al layer 25, TiN layer 26 in the 500 to 1000 Å range is successively formed using reactive sputtering. In forming the TiN layer 26, the tensile or compressive stress of TiN layer 26 is set less than $10^9$ dyne/cm$^2$ to prevent cracks in TiN layer 26 which can be generated in the successive thermal process. To satisfy the condition, the TiN layer is deposited using a reaction chamber at a temperature of 100 to 400° C. and at a pressure of 5 to 20 mTorr.

FIG. 2b shows the cross section of the TiSi$_2$/TiAl$_3$ layer formed at a junction 27 by a successive thermal process. The temperature of the successive thermal process should be below 600° C., otherwise problems such as film lifting and junction breakdown due to the meltdown of the Al layer can result. If the thermal process is performed in a rapid thermal process equipment, it is performed below 600° C. and within 30 seconds. On the other hand, if the thermal process is performed in a furnace, it is performed below 500° C. and within 30 minutes. Both thermal processes are performed in nitrogen ambient.

FIG. 2c shows the cross section of a W layer 29 in the 3000 to 5000 Å range. Referring to FIG. 2c, W layer 29 is planarized after it is deposited on the overall structure to fill in the contact hole.

FIG. 3a to FIG. 3c are the cross sectional views of semiconductor device that sequentially describe the method for forming metal interconnection according to the second embodiment of the present invention.

Referring to FIG. 3a, initially after forming an insulating layer 32 on a silicon wafer 31, a contact hole 33 is made in insulating layer 32 by selectively etching insulating layer 32. Then, an Al layer 34 in the 10 to 100 Å range is formed at the bottom of the contact hole 33 using an Al-0.5%Cu-1%Si target. After the formation of Al 34, a Ti layer 35 in the 300 to 1000 Å range and a TiN layer 36 in the 500 to 1000 Å range are consecutively formed. The process conditions for forming Ti layer 35 and TiN layer 36 are the same with those of the first embodiment.

FIG. 3b shows the cross section of the TiAl$_3$/TiSi$_2$ layer 38 formed at a junction 37 by a successive thermal process. The process condition of the successive thermal process is the same with that of the first embodiment.

FIG. 3c shows the cross section of a W layer 39 in the 3000 to 5000 Å range. Referring to FIG. 3c, W layer 39 is planarized after it is deposited on the overall structure to fill in the contact hole.

According to the invention, the TiAl$_3$ formation resulting from Al thin layer deposition prevents the excessive formation of TiSi$_2$. Therefore, stable contact resistance and low leakage current can be obtained in the application of ultra shallow junction.

What is claimed is:

1. A method for forming metal interconnections of a semiconductor device, comprising the steps of:
    providing a silicon wafer having a surface;
    forming an insulating layer on the surface of the silicon wafer;
    forming a contact hole in the insulating layer, by etching a selected region of the insulating layer to expose a portion of said surface;
    forming a titanium layer within the formed contact hole and on said insulating layer, after post-cleaning the formed contact hole;
    forming an aluminum layer directly on the titanium layer and forming a titanium nitride layer directly on the aluminum layer;
    forming TiSi$_2$/TiAl$_3$ layers at a junction of the titanium layer and silicon wafer, by thermally treating a structure formed by said Ti layer, said Al layer, and said TiN layer on said portion; and
    forming a planarized tungsten layer on said TiN layer, the planarized tungsten layer completely filling the contact hole.

2. The method as claimed in claim 1, wherein said titanium layer is formed in the 300 to 1000 Å range at a temperature between room temperature and 300° C. and at a reaction chamber pressure of 2 to 5 mTorr.

3. The method as claimed in claim 1, wherein said aluminum layer is formed using an Al-0.5%Cu-1% target to produce a controlled thickness in the 10 to 100 Å range on the bottom of the contact hole.

4. The method as claimed in claim 1, wherein said aluminum layer is formed at a temperature below 200° C. and at a pressure below 3 mTorr.

5. The method as claimed in claim 1, wherein said titanium nitride layer is formed in the 500 to 1000 Å range using a reactive sputtering process.

6. The method as claimed in claim 1, wherein said titanium nitride layer is stressed less than $10^9$ dyn/cm$^2$ during formation.

7. The method as claimed in claim 1, wherein said titanium nitride layer is formed using a reaction chamber at a temperature of 100 to 400° C. and at pressure of 5 to 20 mTorr.

8. The method as claimed in claim 1, wherein the thermal process to form said TiSi$_2$/TiAl$_3$ layers is performed in a nitrogen ambient below 600° C. for less than 30 seconds using rapid thermal process equipment.

9. The method as claimed in claim 1, wherein the thermal process to form TiSi$_2$/TiAl$_3$ layers is performed in a nitrogen ambient below 500° C. for less than 30 minutes using a furnace.

10. A method for forming metal interconnections of a semiconductor device, comprising the steps of:
    providing a silicon wafer having a surface;
    forming an insulating layer on the surface of the silicon wafer;
    forming a contact hole in the insulating layer, by etching a selected region of the insulating layer to expose a portion of said surface;
    forming an aluminum layer within the formed contact hole and on said insulating layer, after post-cleaning the formed contact hole;
    forming a titanium layer directly on the aluminum layer and forming a titanium nitride layer directly on the titanium layer;
    forming TiAl$_3$/TiSi$_2$ layers at a junction of the aluminum layer and silicon water by thermally treating a structure formed by said Ti layer, said Al layer, and said TiN on said portion; and
    forming a planarized tungsten layer on said TiN layer, the planarized tungsten layer completely filling the contact hole.

11. The method as claimed in claim 10, wherein said aluminum layer is formed using an Al-0.5%Cu-1% target to produce a controlled thickness in the 10 to 100 Å range on the bottom of the contact hole.

12. The method as claimed in claim 10, wherein said aluminum layer is formed at a temperature below 200° C. and at a pressure below 3 mTorr.

13. The method as claimed in claim 10, wherein said titanium layer is formed in the 300 to 1000 Å range at a temperature between room temperature and 300° C. and at a reaction chamber pressure of 2 to 5 mTorr.

14. The method as claimed in claim 10, wherein said titanium nitride layer is formed in the 500 to 1000 Å range using a reactive sputtering process.

15. The method as claimed in claim 10, wherein said titanium nitride layer is stressed less than $10^9$ dyn/cm$^2$ during formation.

16. The method as claimed in claim 10, wherein said titanium nitride layer is formed using a reaction chamber at a temperature of 100 to 400° C. and at pressure of 5 to 20 mTorr.

17. The method as claimed in claim 10, wherein the thermal process to form said TiSi$_2$/TiAl$_3$ layers is performed in a nitrogen ambient below 600° C. for less than 30 seconds using rapid thermal process equipment.

18. The method as claimed in claim 10, wherein the thermal process to form TiSi$_2$/TiAl$_3$ layers is performed in a nitrogen ambient below 500° C. for less than 30 minutes using a furnace.

* * * * *